(12) United States Patent
Honda et al.

(10) Patent No.: US 6,806,747 B2
(45) Date of Patent: Oct. 19, 2004

(54) OUTPUT CIRCUIT AND MICROCOMPUTER

(75) Inventors: Yoshimitsu Honda, Toyohashi (JP);
Kouichi Maeda, Anjo (JP); Yoshinori Yunosawa, Nukata-gun (JP); Kouji Ichikawa, Kariya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/323,727

(22) Filed: Dec. 20, 2002

(65) Prior Publication Data

US 2003/0117198 A1 Jun. 26, 2003

(30) Foreign Application Priority Data

Dec. 21, 2001 (JP) ........................................ 2001-389541

(51) Int. Cl.[7] ................................................ H03B 1/00
(52) U.S. Cl. ........................ 327/108; 327/112; 326/83
(58) Field of Search ................................ 327/143, 333, 327/108–112, 170, 374, 376, 377, 389, 391; 326/80, 81, 83; 320/166

(56) References Cited

U.S. PATENT DOCUMENTS

| | | | |
|---|---|---|---|
| 5,365,118 A | * | 11/1994 | Wilcox ........................ 327/109 |
| 6,476,586 B2 | | 11/2002 | Yunosawa et al. .......... 320/166 |
| 6,496,036 B2 | * | 12/2002 | Kan .............................. 326/81 |

* cited by examiner

Primary Examiner—Long Nguyen
(74) Attorney, Agent, or Firm—Posz & Bethards, PLC

(57) ABSTRACT

When a control power source voltage becomes lower than an operation guarantee voltage level, the output of a start-up circuit assumes an H-level, a NOR gate produces an output shut-off signal of an L-level, and FETs are turned off. As the control power source voltage further decreases, the output shut-off control circuit loses stability in the operation. In this case, a resistor maintains the FETs in the OFF state due to its pull-down operation. As a result, the output of the output circuit is maintained in a high-impedance state over the whole range of control power source voltages lower than the operation guarantee voltage level.

8 Claims, 4 Drawing Sheets

OUTPUT CIRCUIT AND MICROCOMPUTER

CROSS REFERENCE TO RELATED APPLICATION

This application is based on and incorporates herein by reference Japanese Patent Application No. 2001-389541 filed on Dec. 21, 2001.

FIELD OF THE INVENTION

This invention relates to an output circuit which operates with a control power source voltage and outputs a logic signal to an external circuit, and to a microcomputer provided with the output circuit.

BACKGROUND OF THE INVENTION

A one-chip microcomputer 1 includes, as shown in FIG. 5, a CPU 2 which operates with a control power source voltage VCC1 of, for example, 3.3 V, and a plurality of output ports 5 (FIG. 5 illustrates only one) that convert logic signals output from the CPU 2 into logic signals of a 5-volt system and output them to an external circuit 4 through output terminals 3. Each output port 5 is constructed with a level shift circuit 6 that operates with a control power source voltage VCC2 of 5 V, inverters 7 and 8, an output circuit 9, and the output terminal 3. The output circuit 9 is a totem-pole type circuit comprising a p-channel MOS transistor 10 and an n-channel MOS transistor 11.

The microcomputer 1 can be applied to a variety of control devices. When applied to, for example, an ECU (electronic control unit) mounted on a vehicle, a power source circuit (not shown) provides control power source voltages VCC1 (3.3 V) and VCC2 (5 V) based on a battery voltage VB (12 V).

However, the above control power source voltages VCC1 and VCC2 assume an intermediate value between 3.3 V and 0 V, and an intermediate value between 5 V and 0 V, respectively, when the battery voltage VB drops instantaneously. This voltage drop may arise, for instance, when the ignition switch of the vehicle is changed from OFF to ON or from ON to OFF, when the battery is discharged too much, or when the vehicle is involved in an accident such as collision.

In the case of a CMOS circuit, the elements of the logic circuit undergo unstable logic operation when the control power source voltage becomes smaller than a threshold voltage Vth of the MOS transistor, and the output level loses stability. In the case of a 2-input NAND circuit, it is necessary, in principle, to apply an input voltage which is two or more times as great as the threshold voltage Vth in order to normally output the L-level.

In a low-voltage state where the control power source voltages VCC1 and VCC2 are smaller than the above values, therefore, the CPU 2 and the output port 5 lose stability in the operations often causing the MOS transistor 10 or 11 that should have been turned off to be turned on. In this case, when the MOS transistor 10 or 11 is turned on, the control power source voltage VCC2 or 0 V is output from the output terminal 3 and an electric current flows to the external circuit 4. Due to the output voltage or output current, therefore, an erroneous logic signal is transmitted to the external circuit 4 and as a result the external circuit 4 operates erroneously.

Therefore, the erroneous signals has been prevented by verifying the states of the ports by simulation or testing at the time when the control power source voltages VCC1 and VCC2 are raised or broken or by so designing that the microcomputer 1 and the external circuit 4 work as a whole in cooperation together (e.g., by increasing the capacity when the external circuit 4 is a capacitor). However, limitation is imposed on the external circuit 4 that can be connected, and a lot of laborious work is required for the verification operation or for the cooperative designing as the circuit construction becomes complex.

SUMMARY OF THE INVENTION

It is therefore an object of the present invention to provide an output circuit capable of reliably producing a predetermined logic signal properly even in a case that the control power source voltage drops, and a microcomputer provided with such an output circuit.

According to the present invention, a logic circuit produces a drive control signal to a control signal input terminal of an output transistor, and the output transistor produces a logic signal corresponding to the drive control signal when a control power source voltage lies in an ordinary voltage range or when the control power source voltage that has dropped is still higher than an operation guarantee voltage level (or is higher than a predetermined value that has been set to be higher than the operation guarantee voltage level) on which the logic circuit normally performs the logic operation. In this case, the output transistor performs an operation (source operation) for flowing out an electric current or an operation (sink operation) for absorbing a current depending upon the type of electric conduction thereof or the mode of connection.

A logic circuit is provided with an output shut-off control circuit in a passage for transmitting a drive control signal to the control signal input terminal of the output transistor. In this case, however, the output shut-off control circuit directly produces the drive control signal. Further, a resistance element is connected between the control signal input terminal (gate, base) of the output transistor and the control signal reference terminal (source, emitter). Here, however, the output transistor is turned on or off according to a drive control signal irrespective of the presence of the resistance element. Therefore, the output circuit produces the logic signal in compliance with the drive control signal.

On the other hand, when the control power source voltage has dropped to be lower than the operation guarantee voltage level, the logic circuit may operate unstably failing to normally execute the logic operation. In this case, the output shut-off control circuit produces an output shut-off signal for turning off the output transistor instead of producing the drive control signal. Therefore, even when the logic circuit loses stability in the operation due to a decrease in the control power source voltage, it is allowed to control the output transistor to be turned into OFF.

As the control power source voltage further decreases, however, the output shut-off control circuit constructed with an active element may fail to normally produce the output shut-off signal. In this case, the resistance element works to bring the potential at the control signal input terminal to be close to the potential at the control signal reference terminal. Even when an ON-drive control signal is given to the output transistor, the output transistor is maintained turned off. According to this output circuit, therefore, when at least the control power source voltage has dropped to be lower than the operation guarantee voltage level and the logic circuit is not capable of normally executing the logic operation, the output transistor is reliably controlled to assume a predetermined state, i.e., is turned off, and a predetermined logic signal is reliably output to the external circuit.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT

Figure 1:
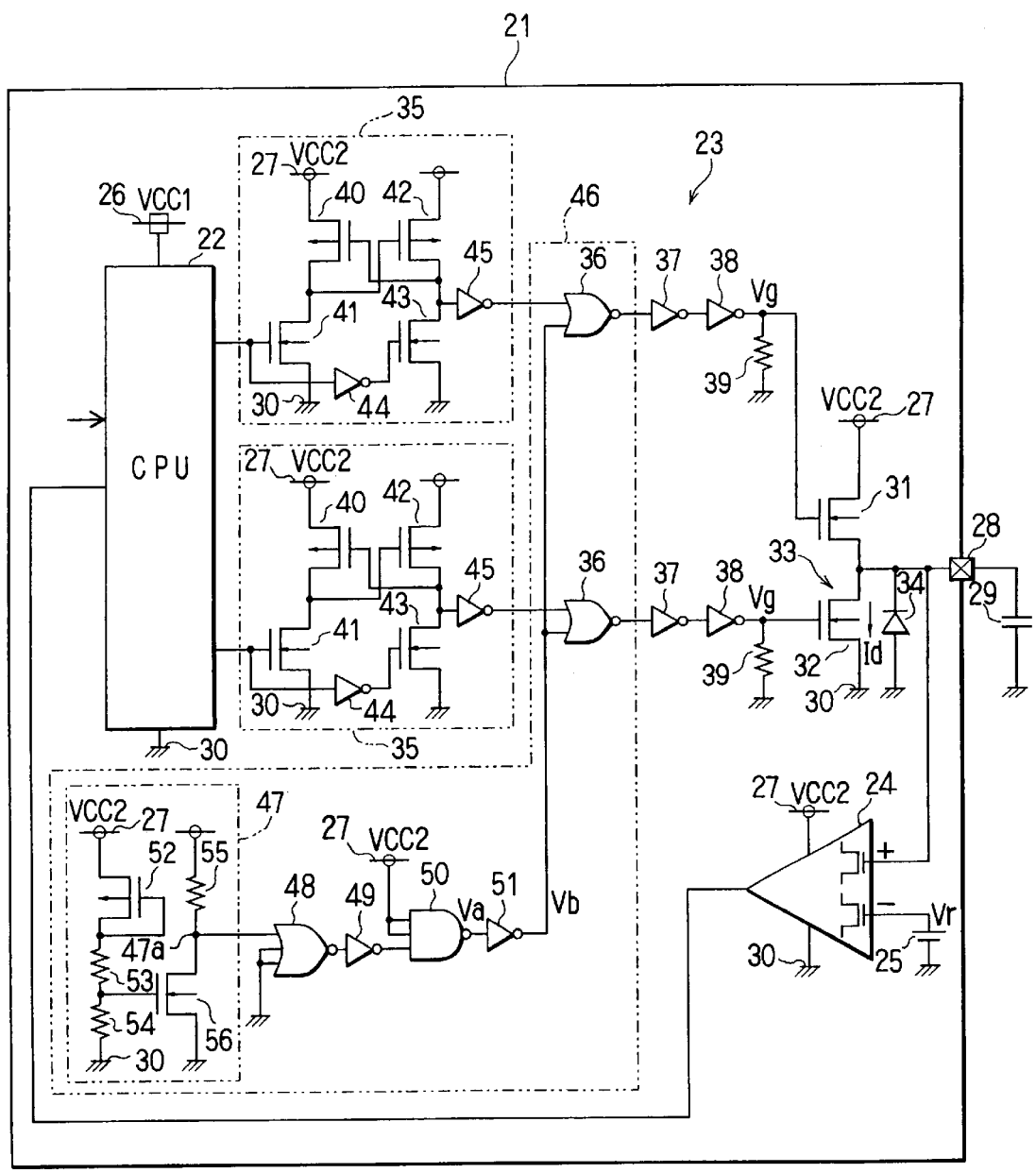
FIG. 1 is a circuit diagram illustrating a microcomputer according to an embodiment of the invention.

Referring to FIG. 1, a microcomputer 21 in a single-chip form is used for a body ECU that is mounted on a vehicle to control door locking. The ECU has a function of changing the locked state in which the doors of the vehicle are maintained locked over to the unlocked state in case an accident such as collision of the vehicle is detected, so that the passengers are allowed to easily get out of the compartment.

The microcomputer 21 is constructed with a CMOS circuit, and includes a CPU 22, an output circuit 23, a comparator 24, a reference voltage generating circuit 25, and a functional circuit block (not shown) such as communication control circuit. The output circuit 23 may be provided in a plural number, and the comparator 24 and the reference voltage generating circuit 25 may be suitably provided depending upon the number of the output circuit 23.

The comparator 24 (voltage discrimination circuit) compares a voltage at an output terminal 28 with a reference voltage Vr (e.g., 0.6 V) provided by the reference voltage generating circuit 25, and outputs the result of comparison to the CPU 22. The input portion of the comparator 24 is so constructed as to withstand a high voltage and requires no diode for input protection.

The CPU 22 operates upon with a control power source voltage VCC1 of 3.3 V from a power source line 26, and other circuit portions operate with a control power source voltage VCC2 of 5 V from a power source line 27. The ECU includes a power source circuit (not shown) which receives a battery voltage VB and produces the control power source voltages VCC1 and VCC2.

The output circuit 23 is an output port formed on a pad cell portion, and produces a logic signal produced by a register in the CPU 22 to a capacitor 29 (external circuit) connected to the terminal 28. The drains and sources of the N-channel FETS 31 and 32 (output transistors) are connected between the power source line 27 and the terminal 28, and between the terminal 28 and the ground 30. A totem-pole type circuit 33 is constructed with the FET 31 at the high side and with the FET 32 at the low side.

A diode 34 is a parasitic diode formed accompanying the FETs 31 and 32. Upon connecting the back gates of the FETs 31 and 32 to the ground 30, the diode 34 is connected in a reverse direction between the drain of the FET 32 (source of the FET 31) and the ground 30. The gate and source of the FETs 31 and 32 correspond to the control signal input terminal and the control signal reference terminal.

The logic circuits from the register in the CPU 22 to the FETs 31 and 32 both have the same construction, and the circuit elements thereof are denoted by the same reference numerals in FIG. 1. In the logic circuit leading to the FET 32, the output of the register in the CPU 22 is connected to the gate of the FET 32 through a level shift circuit 35, an NOR gate 36 and inverters 37, 38. A pull-down resistor 39 is connected between the gate and the source of the FET 32. The logic circuit leading to the FET 31 is constructed similarly.

Figure 4:
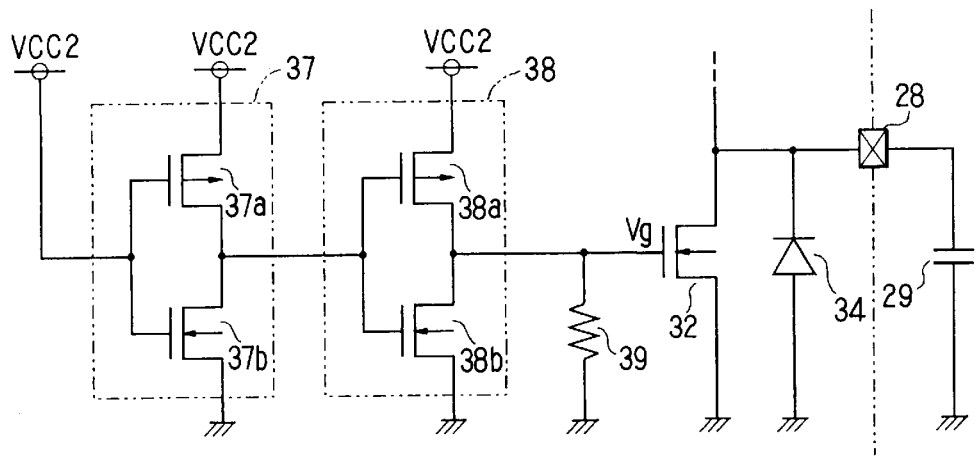
FIG. 4 is a circuit diagram illustrating a circuit to be simulated, the results of which are shown in FIG. 3.
Figure 5:
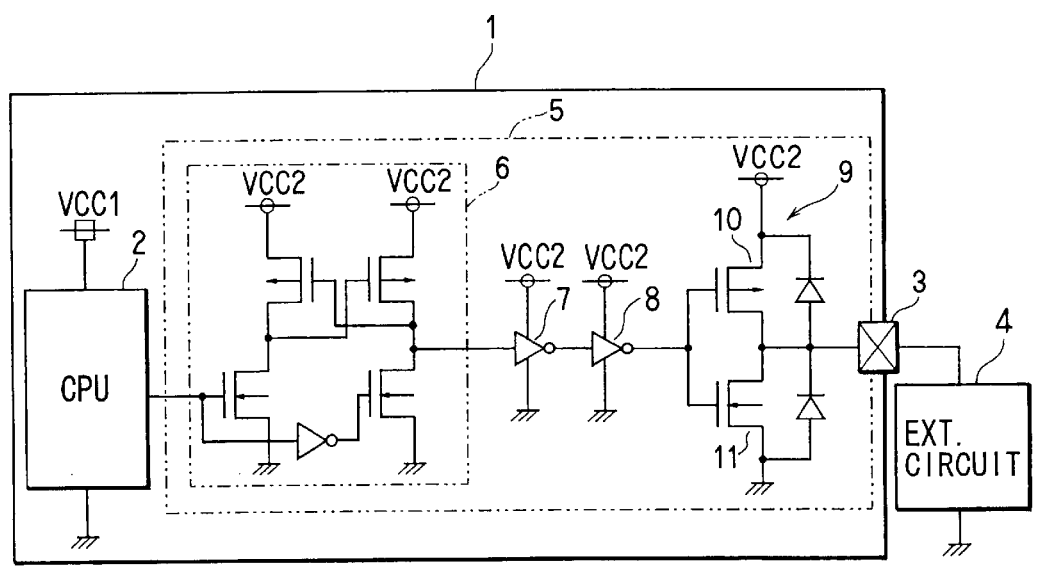
FIG. 5 is a circuit diagram illustrating a microcomputer according to a related art.

As shown in FIG. 4, the inverter 38 for driving the gate of FET 32 is constructed with two drive elements, that is, a p-channel FET 38a and an n-channel FET 38b. Similarly, the inverter 37, too, is constructed with a p-channel FET 37a and an n-channel FET 37b.

The level shift circuit 35 interposed in the logic circuit converts logic signals of a 3.3 V system produced by the CPU 22 into logic signals of a 5 V system. FETs 40 and 41, and FETs 42 and 43 are connected in series, respectively, between the power source line 27 and the ground 30. The gate of the FET 40 is connected to the common sources of the FETs 42 and 43, and the gate of the FET 42 is connected to the common sources of the FETs 40 and 41. The output of the register in the CPU 22 is directly connected to the gate of the FET 41 and is further connected to the gate of the FET 43 through an inverter 44. The common sources of the FETs 42 and 43 are connected to one input terminal of the NOR gate 36 through an inverter 45. Here, the inverter 44 alone operates with the control power source voltage VCC1.

The NOR gate 36 (a gate circuit) forms a portion of the output shut-off control circuit 46. When the control power source voltage VCC2 has dropped, the output shut-off control circuit 46 produces an output shut-off signal to the gates of the FETs 31 and 32 instead of the logic signal (i.e., instead of the drive control signal) from the CPU 22. The output terminal 47a of a start-up circuit 47 is connected to the other input terminal of the NOR gate 36 through the NOR gate 48, inverter 49, NAND gate 50 and inverter 51. Here, the input is so processed that the NOR gate 48 and the NAND gate 50 work simply as inverters and, hence, the circuit portion can be omitted from the NOR gate 48 through up to the inverter 51.

When the control power source voltage VCC2 becomes lower than the operation guarantee voltage level V1, the logic circuit having the CMOS circuit construction may fail to normally execute the logic operation. The start-up circuit 47 (power source voltage discrimination circuit) detects the control power source voltage VCC2 that has dropped to be lower than the operation guarantee voltage level V1. Namely, between the power source line 27 and the ground 30, a first series circuit of resistors 53, 54 and a p-channel FET 52 the gate and drain of which are connected together is connected. Also a second series circuit of a resistor 55 and an n-channel FET 56 is connected in parallel to the first series circuit. The gate of the FET 56 is of a guard ring structure and is connected to a point where the resistors 53 and 54 are connected in common. The output terminal 47a is a point where the resistor 55 and the drain of the FET 56 are connected in common.

According to this embodiment, in case the vehicle is involved in an accident such as collision, an acceleration sensor (not shown) detects the shock of accident as a particular change in the state and produces a detection signal. Then, the CPU 22 drives the gate of the FET 31 only to be H-level to turn on the FET 31. Then, the capacitor 29 is electrically charged through a passage of the power source line 27, FET 31 and terminal 28. The capacity of the capacitor 29 is, for example, about 1 μF.

When the FET 31 is turned off after the capacitor 29 is electrically charged, the terminal 28 assumes a high-impedance state enabling the electric charge to be held in the capacitor 29. In this case, the parasitic diode 34 is biased in reverse to the ground 30. Thus there is no passage for releasing the electric charge from the capacitor 29.

As the microcomputer 22 is once reset and is then released, the CPU 22 makes a reference to the output signal level of the comparator 24. Here, the capacitor 29 has been electrically charged and, hence, the comparator 24 produces an output signal of the H-level. After having recognized that the output signal is of the H-level, the CPU 22 drives the gate of the FET 32 only to be H-level so as to turn on the FET 32. Then, the capacitor 29 is discharged through the passage of terminal 28, FET 32 and ground 30. Next, the CPU 22 produces a drive control signal to a door lock drive circuit (not shown) thereby to change the door state where the doors of the vehicle are all locked over to the unlocked state. Here, after having confirmed that the output signal is of the H-level, the CPU 22 may change the state into the state where the doors are unlocked and may, then, drive the gate of the FET 32 to the H-level, so that the capacitor 29 is electrically discharged.

In an event of a collision, the battery voltage VB may drop temporarily. With the battery voltage VB, the power source circuit (not shown) normally provides the control power source voltage VCC2 and provides the control power source voltage VCC1 by using the control power source voltage VCC2. As the battery voltage VB drops, therefore, the control power source voltage VCC2, first, starts decreasing from 5 V and, then, the control power source voltage VCC1 starts decreasing from 3.3 V. The capacitor 29 works as a storage device for storing "the receipt of shock" while the microcomputer 22 is being reset accompanying a decrease in the control power source voltages VCC1 and VCC2.

However, the logic circuit such as the output circuit 23 tends to execute the logic operation unstably when the control power source voltage VCC2 becomes lower than the operation guarantee voltage level V1. Therefore, despite the capacitor 29 storing the occurrence of shock is maintained in the electrically charged state, the FET 31 or 32 may be turned on. To cope with this, the start-up circuit 47 continues to monitor the control power source voltage VCC2.

When the control power source voltage VCC2 is not lower than the operation guarantee voltage level V1, the voltage across both terminals of the resistor 54 becomes greater than the threshold voltage Vth of the FET 56, whereby the FET 56 is turned on, and the output terminal 47a assumes the L-level which is then applied to the NOR gate 36. As a result, the drive control signal output from the level shift circuit 35 passes through the NOR gate 36 and is applied to the gates of the FETs 31 and 32. Namely, the FETs 31 and 32 are driven according to the output of the register in the CPU 22.

When the control power source voltage VCC2 becomes lower than the operation guarantee voltage level V1, on the other hand, the voltage across the terminals of the resistor 54 becomes smaller than the threshold voltage Vth of the FET 56, whereby the FET 56 is turned off, and the output terminal 47a assumes the H-level which is then applied to the NOR gate 36. As a result, the NOR gate 36 produces an output shut-off signal of the L-level irrespective of the drive control signal from the level shift circuit 35, and the output shut-off signal is fed to the gates of the FETs 31 and 32. Accordingly, the FETs 31 and 32 are turned off irrespective of the output of the register in the CPU 22.

According to the above operation, the FETs 31 and 32 are forcibly turned off when the control power source voltage VCC2 has so dropped that the logic circuit can no longer properly operate, so that the unexpected charge current or the discharge current will not flow into, or out of, the capacitor 29. When the control power source voltage VCC2 further drops, however, the output shut-off control circuit 46 operates unstably, and the above output shut-off function may not be exhibited to a sufficient degree.

Figure 2:
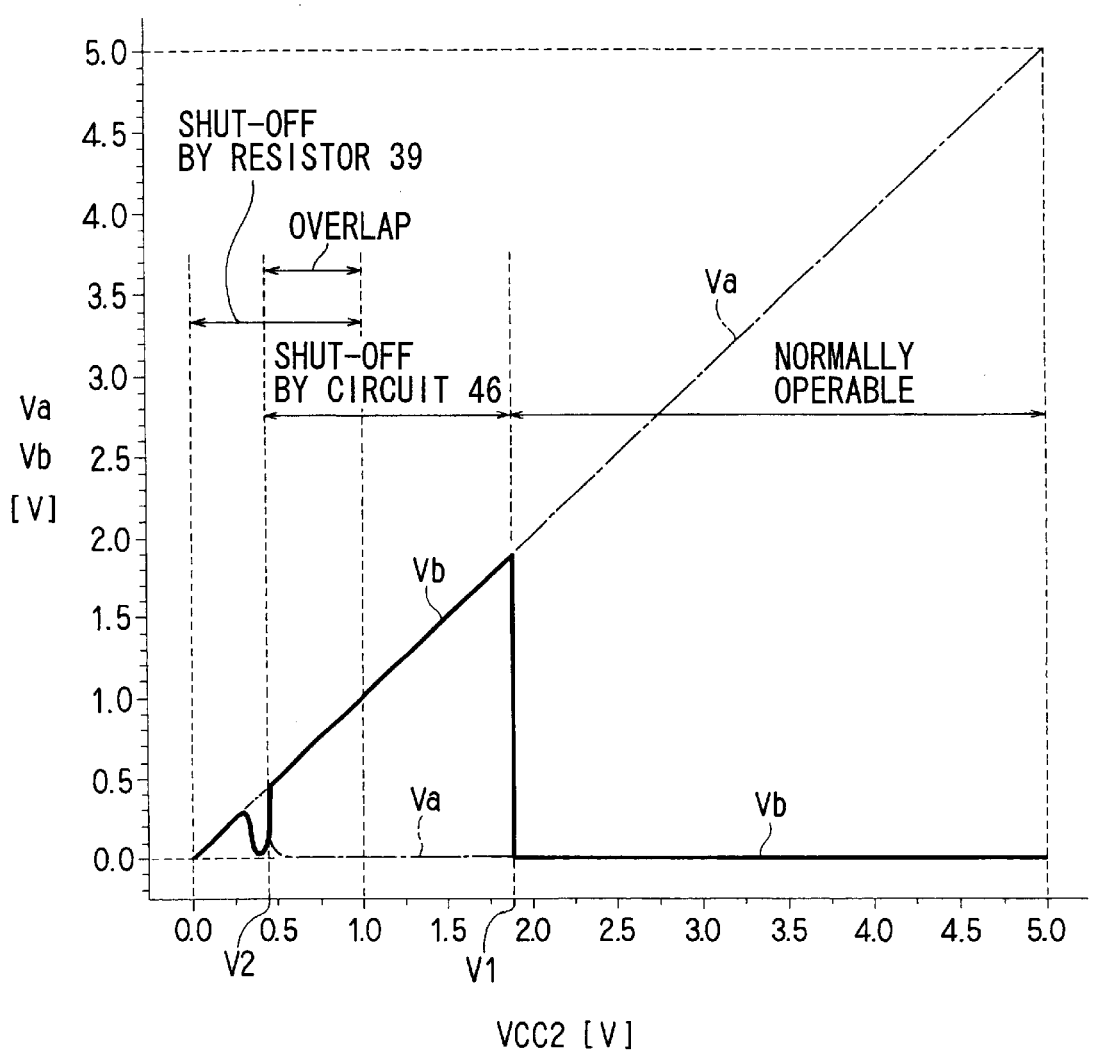
FIG. 2 is a diagram illustrating the results of simulation of voltages Va and Vb with respect to a control power source voltage VCC2.

FIG. 2 illustrates the results of simulation representing the output voltage Va of the NAND gate 50 and the output voltage Vb of the inverter 51 with respect to the control power source voltage VCC2. The results are those at 125° C., and the abscissa represents the control power source voltage VCC2 and the ordinate represents the output voltages Va and Vb. When the control power source voltage VCC2 drops from 5 V, the output voltage Vb remains 0 V (L-level) until the operation guarantee voltage level V1 (1.85 V) is reached. As the control power source voltage VCC2 further becomes lower than the operation guarantee voltage level V1, the output voltage Vb changes into the control power source voltage VCC2 (H-level). This operation complies with the output shut-off operation described above. As the control power source voltage VCC2 further decreases down to the voltage level V2 (0.45 V), however, the output voltage Vb is inverted into 0 V (L-level). This indicates that the output shut-off control circuit 46 is no longer capable of exhibiting the output shut-off function.

According to this embodiment, therefore, the resistance R39 of the resistor 39 is set so that the FETs 31 and 32 are turned off irrespective of the output logic of the NOR gate 36 in at least a period in which the control power source voltage VCC2 remains smaller than the voltage level V2. In this case, the operation condition in which they are least likely to be turned off is the one where the output of the NOR gate 36 (input to the inverter 37) is of the H-level as shown in FIG. 4. Under this operation condition, the FET 38a on the high side of the inverter 38 is turned on and the gate voltage Vg assumes a value given by the following formula (1), $$Vg = R39/(R38a+R39) \times VCC2 \quad (1)$$

where R38a is the on-resistance of the FET 38a.

In order for the FETs 31 and 32 to be turned off in at least a period in which the control power source voltage VCC2 is lower than the voltage level V2, the resistance 39 may be set so as to satisfy the condition given by the following formula (2), $$R39/(R38a+R39) \times V2 < Vth \quad (2)$$

where Vth is a threshold voltage of the FETs 31 and 32.

In the period in which the control power source voltage VCC2 is greater than the operation guarantee voltage level V1, on the other hand, the FETs 31 and 32 must be capable of being turned on and off according to the signal output from the NOR gate 36 irrespective of the presence of the resistor 39. Therefore, the resistance R39 is set so as to satisfy the condition represented by the following formula (3), $$R39/(R38a+R39) \times V1 > Vth \quad (3)$$

Figure 3:
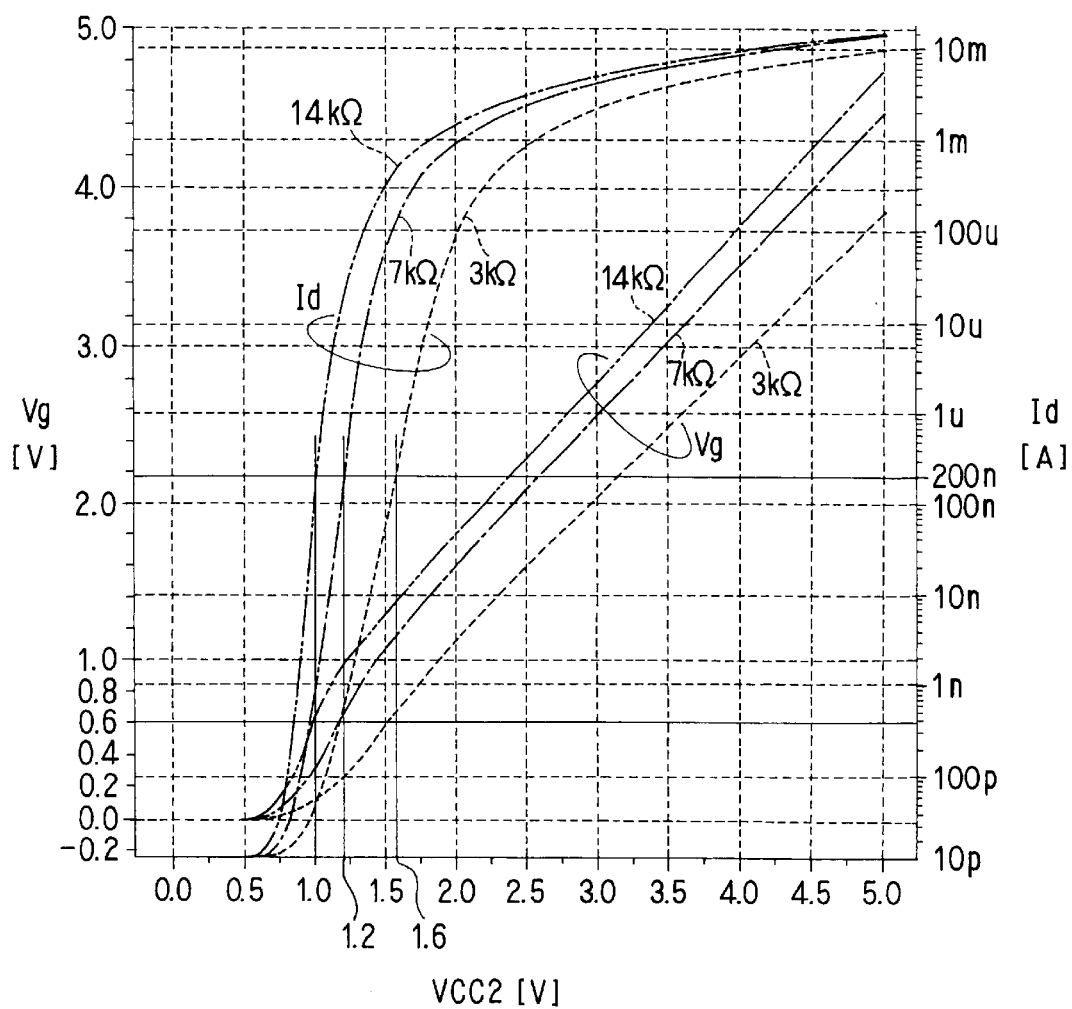
FIG. 3 is a diagram illustrating the results of simulation a current Id and a gate voltage vg with respect to the control power source voltage VCC2.

FIG. 3 illustrates the results of simulation representing the current Id flowing into the FET 32 and the gate voltage Vg with respect to the control power source voltage VCC2 under the operation conditions shown in FIG. 4. The results are those at 125° C., and the abscissa represents the control power source voltage VCC2 and the ordinate represents the current Id (right side) and the gate voltage Vg (left side). Broken lines, dot-dash chain lines and two-dot chain lines in FIG. 3 represent characteristics when the resistor 39 has a resistance R39 of 3 kΩ (lower-limit value), 7 kΩ (standard value) or 14 kΩ (upper-limit value). This is done by taking into consideration a range of variation in the resistance R39 in the process of manufacturing the ICs.

A decrease in the resistance R39 is accompanied by an increase in the effect of pull-down, whereby the gate voltage Vg decreases and the current Id decreases. By taking into consideration the fact that a change in the voltage of the capacitor 29 becomes very small when the current Id is smaller than 200 nA, the gate voltage of 0.6 V corresponding to the current is selected to be the threshold voltage Vth. Then, irrespective of the variation in the resistance R39, the FET 32 can be reliably maintained in the OFF state due to the operation of the resistor 39 when the control power source voltage VCC2 becomes lower than 1.0 V. This voltage is higher than the voltage level V2 (0.45 V) at which the output shut-off control circuit 46 exhibits the output shut-off function. Accordingly, a range in which the output shut-off control circuit 46 shuts off the output for the control power source voltage VCC2 overlaps a range in which the resistor 39 shuts-off the output. Therefore, the output condition can be reliably controlled over the whole range of the control power source voltage VCC2.

Irrespective of the variation in the resistance R39, further, the FET 32 is turned on according to the ON drive control signal as the control power source voltage VCC2 becomes greater than 1.4 V. This voltage is lower than the operation guarantee voltage level V1 (1.85 V). Therefore, the resistor 39 does not hinder the ON/OFF operation of the FET 32 which is responsive to the drive control instruction from the CPU 22.

As described above, the output circuit 23 provided in the microcomputer 21 has the output shut-off control circuit 46, and is capable of turning off the FETs 31 and 32 by the output shut-off signal when the control power source voltage VCC2 has dropped down to be lower than the operation guarantee voltage level V1. Further, the resistances R39 of the resistors 39 connected between the gates and sources of the FETs 31, 32 are so set as to satisfy the formula (2) making it possible to maintain the FETs 31 and 32 in the OFF state even in a range of lower control power source voltages in which the output shut-off control circuit 46 may lose stability in the operation.

It is therefore possible to maintain the output of the output circuit 23 in a high-impedance state throughout the whole range of control power source voltage lower than the operation guarantee voltage level V1. Thus, unexpected charge current or discharge current will not flow into, or out of, the capacitor 29. Therefore, even in case the control power source voltages VCC1 and VCC2 have temporarily dropped due to, for example, collision of the vehicle, the electric charge is reliably held in the capacitor 29 which stores the shock given to the vehicle as the amount of electric charge. In order for the passengers to get out of the vehicle, the microcomputer 22 changes the state in which the doors are locked over to the state in which the doors are unlocked relying upon the terminal voltage of the capacitor 29.

Besides, since the resistor 39 is set so as to satisify the formula (3), the operation conditions of the FETs 31 and 32 are not limited by the presence of the resistor 39 at least when the control power source voltage VCC2 is not smaller than the operation guarantee voltage level V1.

Besides, the output portion of the output circuit 23 is constructed with the totem-pole type circuit 33 comprising n-channel FETs 31 and 32, and the back gates of the FETs 31 and 32 are connected to the ground potential. Therefore, the parasitic diode 34 is formed on the low side only, and the electric charge held in the capacitor 29 does not flow to the side of the power source line 27. Further, the input portion of the comparator 24 that is designed to be resistant against high voltages obviates the need of providing a diode for input protection, enabling the non-inverted input terminal to be directly connected to the positive side terminal of the capacitor 29.

The present invention is not limited to the embodiment that is described above and illustrated in the drawings, but can be modified or expanded, for example, as described below.

That is, the external circuit may be the input circuit of another microcomputer or may be a load circuit of any kind.

Though the output shut-off control circuit 46 is so constructed as to produce the output shut-off signal when the control power source voltage VCC2 has dropped down to be lower than the operation guarantee voltage level V1, it is allowable to so construct that the output shut-off signal is produced when the control power source voltage VCC2 has dropped down to be lower than a predetermined voltage level that is set to be higher than the operation guarantee voltage level V1 to have a tolerance.

The resistance element may be any element having resistance, such as an FET with its gate and drain connected together.

The voltage discrimination circuit may be constructed with an inverter instead of the comparator 24. The output circuit 23 may be used together with other circuits instead of being used as part of the microcomputer.

What is claimed is:

1. An output circuit which operates with a control power source voltage and produces a logic signal to an external circuit, the output circuit comprising:

an output transistor configuration for allowing an electric current to flow to and from the external circuit;

a logic circuit which supplies a drive control signal necessary for producing the logic signal to the control signal input terminal of the output transistor configuration;

an output shut-off control circuit, provided in a passage for transmitting the drive control signal to the control signal input terminal of the output transistor configuration in the logic circuit, for producing an output shut-off signal for turning off the output transistor configuration instead of producing the drive control signal when the control power source voltage is at least lower than an operation guarantee voltage level at which the logic circuit normally executes the logic operation; and a resistance element connected between the control signal input terminal of the output transistor configuration and a control signal reference terminal, and having a resistance capable of maintaining the output transistor configuration in an OFF state when the output shut-off control circuit is incapable of producing the output shut-off signal due to a drop in the control power source voltage.

2. The output circuit according to claim 1 wherein the resistance of the resistance element is set so that output transistor configuration is turned on according to the drive control signal when the control power source voltage is not lower than the operation guarantee voltage level.

3. The output circuit according to claim 1, wherein the output shut-off control circuit includes:

a power source voltage discrimination circuit which produces the output shut-off signal when the control power source voltage is at least lower than the operation guarantee voltage level; and a gate circuit which receives the drive control signal and the output shut-off signal, and produces the output shut-off signal with priority over the drive control signal.

4. The output circuit according to claim 1, wherein:

the output transistor configuration comprises a FET, and the logic circuit includes a drive element that supplies the control power source voltage to the gate of the FET in response to an ON-drive control signal; and the resistance of the resistance element is set so that a voltage produced by dividing the control power source voltage by the on-resistance of the drive element and by the resistance of the resistance element is not larger than the threshold voltage of the FET when the shut-off control circuit is incapable of normally producing the shut-off signal.

5. The output circuit according to claim 1, wherein the output transistor configuration comprises in a totem-pole type circuit of n-channel FETs.

6. A microcomputer including the output circuit of claim 1.

7. The microcomputer according to claim 6, wherein:

the external circuit is a capacitor; and a voltage discrimination circuit is provided for discriminating a voltage level across the capacitor.

8. The microcomputer according to claim 7, wherein the microcomputer is mounted on a vehicle, and the capacitor is electrically charged when a shock greater than a predetermined value is detected to have been given to the vehicle.

* * * * *